(12) United States Patent
Jimenez Mejia et al.

(10) Patent No.: US 10,031,184 B2
(45) Date of Patent: Jul. 24, 2018

(54) METHOD AND SYSTEM FOR THE DETECTION AND DIAGNOSIS OF FAULTS IN RUNNING ELECTRIC MACHINES

(71) Applicants: Universidad Nacional de Colombia, Bogota (CO); EMPRESAS PUBLICAS DE MEDELLIN E.S.P., Medellin (CO)

(72) Inventors: Raúl Esteban Jimenez Mejia, Medellin (CO); Guillermo León Mesa Betancur, Medellin (CO)

(73) Assignees: Universidad Nacional de Colombia, Bogota (CO); Empresas Publicas de Medellin E.S.P., Medellin (CO)

( * ) Notice: Subject to any disclaimer, the term of this patent is extended or adjusted under 35 U.S.C. 154(b) by 274 days.

(21) Appl. No.: 14/773,321

(22) PCT Filed: Mar. 4, 2014

(86) PCT No.: PCT/IB2014/059431
§ 371 (c)(1),
(2) Date: Sep. 4, 2015

(87) PCT Pub. No.: WO2014/136052
PCT Pub. Date: Sep. 12, 2014

(65) Prior Publication Data
US 2016/0018467 A1    Jan. 21, 2016

(30) Foreign Application Priority Data
Mar. 5, 2013    (CO) .................................. 13-044020

(51) Int. Cl.
*G01R 31/02*    (2006.01)
*G01R 31/06*    (2006.01)
(Continued)

(52) U.S. Cl.
CPC ......... *G01R 31/343* (2013.01); *G01R 31/025* (2013.01)

(58) Field of Classification Search
CPC ........................... G01R 31/343; G01R 31/025
(Continued)

(56) References Cited

U.S. PATENT DOCUMENTS 4,414,539 A * 11/1983 Armer .................. G01R 31/008
340/500
4,851,766 A 7/1989 Shiobara et al.
(Continued)

OTHER PUBLICATIONS

Certificate of Issue of Counterpart Colombian Patent, dated Mar. 5, 2013.

*Primary Examiner* — Ly D Pham
(74) *Attorney, Agent, or Firm* — The Morales Law Firm; Joseph L. Morales

(57) ABSTRACT

The present invention discloses a method for the detection and diagnosis of faults in running electric machines. The method consists of: i) simultaneously obtaining a current signal and a voltage signal associated with the rotor winding of the electric machine; ii) defining a group of vectors whose components are DC and/or AC values at different separation and amplification levels of the current and voltage signals; iii) simultaneously obtaining a current signal and a voltage signal associated with an emulated fault; iv) defining a group of vectors whose components are DC and/or AC values at different separation and amplification levels of the current and voltage signals associated with an emulated fault; v) determining the variations in the components of the vectors; vi) comparing the vectors that show component variations with the emulated fault vectors; vii) analyzing the variations and comparisons in order to detect whether or not there is at least one type of fault; and viii) reporting the presence or absence of at least one type of fault in the electric machine.

(Continued)

The present invention also discloses a system to carry out this method, consisting of: i) a unit that obtains the current and voltage signals associated with the winding of the electric machine; ii) a unit that emulates faults; iii) a unit that sensitizes the signals by separating the DC and/or AC levels and amplifies the resulting signal; iv) a memory unit that stores the DC and/or AC values; and v) a unit that processes, analyzes and reports on the status of the machine.

4 Claims, 11 Drawing Sheets

(51) Int. Cl.
  *G01R 21/00* (2006.01)
  *G01R 31/34* (2006.01)
(58) Field of Classification Search
  USPC .................... 702/58, 35; 324/546, 765.01
  See application file for complete search history.

(56) References Cited

U.S. PATENT DOCUMENTS

| | | |
|---|---|---|
| 2004/0189279 A1 | 9/2004 | Rao |
| 2006/0067024 A1* | 3/2006 | Chemisky ............ F02D 41/2096 |
| | | 361/139 |
| 2011/0234181 A1 | 9/2011 | Hobelsberger et al. |
| 2015/0229149 A1* | 8/2015 | Fahlenkamp ......... H02J 7/0044 |
| | | 320/114 |
| 2015/0280623 A1* | 10/2015 | Fujie ................... H02M 7/5387 |
| | | 318/400.21 |

* cited by examiner

METHOD AND SYSTEM FOR THE DETECTION AND DIAGNOSIS OF FAULTS IN RUNNING ELECTRIC MACHINES

1. TECHNICAL FIELD

The present invention falls within the technical field of instruments or devices that measure electrical variables in order to detect faults by comparison with a reference value, and is specifically used with running electric machines.

2. PRIOR ART

Detecting faults in electric machines, such as electrical and mechanical faults (e.g., rotor winding faults in electric generators, as in the generator shown in FIG. 1) has always been of great interest to the electricity generation industry, given early fault detection prevents massive losses due to repairing machinery damaged by undetected failures, and mitigates loss of profits caused by unplanned machine shutdown. It is known from prior art that fault detection in wound rotors has been undertaken using methods that require altering the machines' normal operation. For example, the machine must be shut down, existing circuits must be intervened, and signals must be injected into the circuits, among others.

Typically, fault detection and diagnostics requires the use of a wide variety of sensors to collect data on machines' functional parameters and variables. The following variables stand out among those to be measured by these sensors: voltage and current, vibration of moving parts, magnetic flux in the air gap, internal and external temperature, among others.

Among the fault detection techniques of electric machines, previous knowledge of collected measurements is often required in order to distinguish normal working conditions from faulty working conditions. This requirement of previous knowledge about the machine's normal working conditions is magnified when fault detection is carried out while the machine is running, where there are additional factors that can affect the measurements. These distortions of the measurements must not be confused with faults in the electric machine.

U.S. Pat. No. 4,851,766 discloses a method for detecting faults related to inter-layer shorting of the rotor winding of an electric machine. The method consists of injecting an external AC voltage signal into the circuit associated with the machine's excitation voltage and detects faults based on the AC impedance value. In this fashion, this circuit uses a process entailing invasive signal injection into the excitation circuit, which can affect the electric machine's normal operation.

US Patent 2011/0234181 discloses a method for detecting electric machine rotor faults based on calculating the impedance of the rotor winding by measuring voltage and current; but this method only considers AC analysis.

Other methods proposed in prior art for fault detection resort to measuring a different kind of variable, such as magnetic flux, rotor vibration, torque, among other variables. However, measuring these faults entails the inclusion of extraneous elements in order to measure said variables, as is the case of US Patent Application 2004/0189279, in which inter-layer shorting of the rotor winding while the machine is running is detected, but requires the addition in advance of a probe to measure magnetic flux, which requires shutting down the machine to assemble the probe within the machine.

Thus, there is a latent unsatisfied need for an effective solution for detecting and diagnosing faults in running electric machines, without having to stop the machine or inject signals into the electric machine's excitation circuit.

3. FIGURE DESCRIPTIONS

FIG. 1 shows a diagram of a conventional generator-type electric machine composed of a static excitation system (1) that powers the field circuit (2) and makes current flow through the rotor winding (4) by means of sliding contacts (3). The rotor (4) is mechanically coupled to the turbine (5) by the shaft (6), whose turning induces voltage in the stator winding (7).

FIG. 2 shows an electric diagram of the rotor's equivalent circuit (4), this circuit shows the following: resistance parameters (8), which allow for the detection of faults related to the mechanical splice between windings and winding resistance; and the inductance and capacitance (9) parameters, which allow for the detection of faults related to the core and the insulation of the winding. This figure also shows the way to connect the fault-measurement system (10) of the present invention.

FIG. 3 shows a diagram of the fault-measurement system (10). This system is comprised of: i) three probes (a), (b) and (c) that allow for the acquisition of the field voltage by connecting two probes (a) and (c) and the shunt voltage Vsh by connecting two probes (a) and (b), which is related to the field current If; ii) a unit that emulates faults (11); iii) a diagram of the voltage divider (12); iv) a unit that separates and amplifies the signal (13); v) a memory unit (14); and vi) a unit that processes, analyzes and reports on the status of the machine (15).

FIGS. 4, 4A and 4B show a diagram of the electrical system of the sensitization unit (13), which is set up with the following stages: i) first separation and amplification of the DC value of the current and field voltage signals (17); ii) first separation and amplification of the AC value of the current and field voltage signals (18); iii) second DC separation and amplification (19); iv) second AC separation and amplification (20); and v) third DC separation and amplification (21). The same separation and amplification stages for the field voltage signal are shown (22), (23), (24), (25) and (26). The vectors of DC values are determined based on the DC values obtained from each stage, for field current as well as for field voltage (27) and (28) respectively.

4. DETAILED DESCRIPTION OF THE INVENTION

Glossary

Static excitation system: The system responsible for powering the rotor winding and making a current flow through it.

Field circuit: The circuit comprised of the rotor winding and the excitation system.

Sensitization: the process applied to a signal to detect small changes in the signal.

The present invention discloses a method and a system for detecting and diagnosing faults in running electric machines based on the acquisition, sensing, and processing of the current and voltage signals from the winding of an electric machine. It should be understood that in the present invention, a fault refers to permanent variation of the resistance, capacitance or inductance components, outside of the determined range of values for the normal working state of an electric machine.

In order to facilitate understanding of the scope of the method and the system of the present invention, the invention's operation will be described in the context of electricity generator rotors, but a skilled person in the art should understand that the operating principle of the present invention can be applied to any type of electric machine.

Electricity generators are machines that are able to sustain a potential difference between two points called terminals by converting mechanical energy into electrical energy. This conversion is carried out by the relative movement between an electromagnet and an electrical conductor, thereby generating an electromotive force (EMF) in accordance with Faraday's Law. At electric power plants (nuclear, thermal, hydraulic), the mechanical energy that the generator converts to electrical energy originates from the movement of a turbine, powered by water vapor, air or water, depending on the type of power plant.

Figure 1:
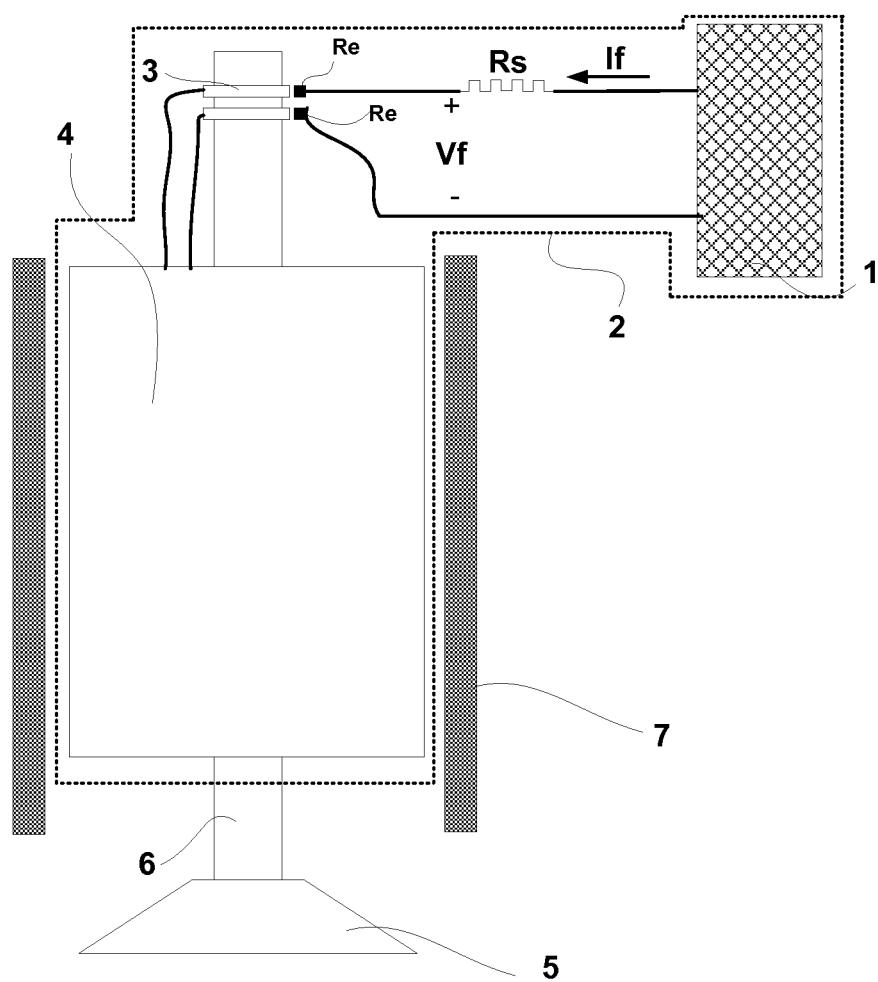

FIG. 1 shows a diagram of an electric generator-type rotary electric machine that converts mechanical energy into electrical energy. This generator is comprised of a static excitation system (1) that powers the field circuit (2) of the machine and makes current flow through the rotor winding (4) by means of sliding contacts (3). The rotor (4) is mechanically coupled to a turbine (5) by the shaft (6), to induce voltage in the stator winding (7), which is the static part of the generator and upon which voltage is induced.

Figure 2:
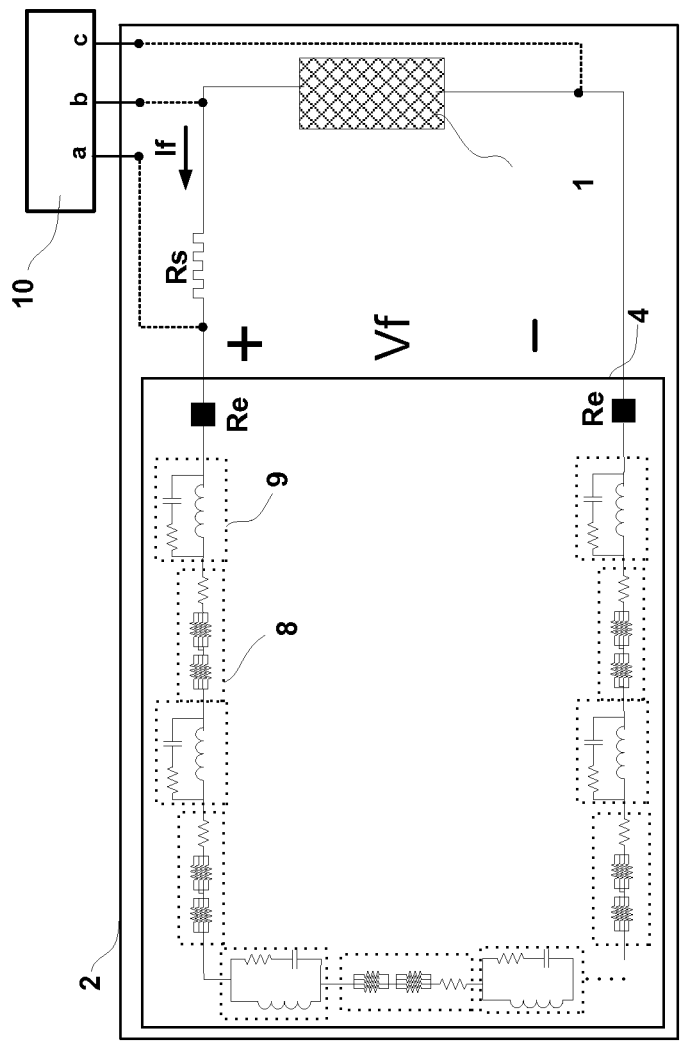

The method and system of the present invention can be applied to detecting and diagnosing faults in the field circuit (2) of the electricity generators, such as the one shown in the diagram in FIG. 1, and in the circuit diagram in FIG. 2. The field circuits (2) of this type of machine are generally composed of an excitation system (1) and a rotor winding (4). The rotor winding (4) is powered by the excitation system (1) that applies a voltage to the rotor winding (4) terminals by means of a system of sliding contacts (3) and makes an electric current If flow through the rotor winding (4). It should be understood that the field circuit is responsible for generating the magnetic field in the rotor to induce voltage in the stator.

FIG. 2 shows a circuit diagram of the rotor winding (4), which is composed of a field circuit (2) that contains inductances and resistances equal to the winding and the splice between windings, and an excitation system (1). The present invention preferably deals with laminated splices. A laminated splice refers to a splice composed of a set of conductive sheets attached by its ends. The present invention can also be used for rigid splices, where the windings are connected by means of a conductive part without internal lamination. For the purposes of electric circuit representation, the splice is depicted as a resistive component, by a group of parallel resistances (8).

The fault measurement, detection and diagnosis system (10) obtains information about the rotor through the connection of three probes (a), (b) and (c) to the field circuit (2). To measure the current If, the voltage drop in the shunt resistance Rs between probes (a) and (b) is measured, and to measure the field voltage Vf associated with the rotor winding, the voltage drop over a voltage divider between probes (b) and (c), which are connected to the ends of the excitation system (1), is measured.

The way in which the present invention detects permanent faults of the resistive, capacitive or inductive components of electric machine rotors will be described below.

Faults associated with the resistive component (8) are detected by measuring the variation in the DC components of the current that flows through the field circuit (2). The faults in the resistive component can be: i) broken sheets in laminated splices; ii) cracks in the connections; iii) interlayer shorting; and iv) issues with the electric contact system.

Faults associated with the inductive and capacitive components (9) are detected by measuring the variation in the AC components of the current that flows through the field circuit (2). The faults in these components can be: i) faults in the pole nuclei; ii) insulation faults; and iii) broken damping rods.

Figure 5A:
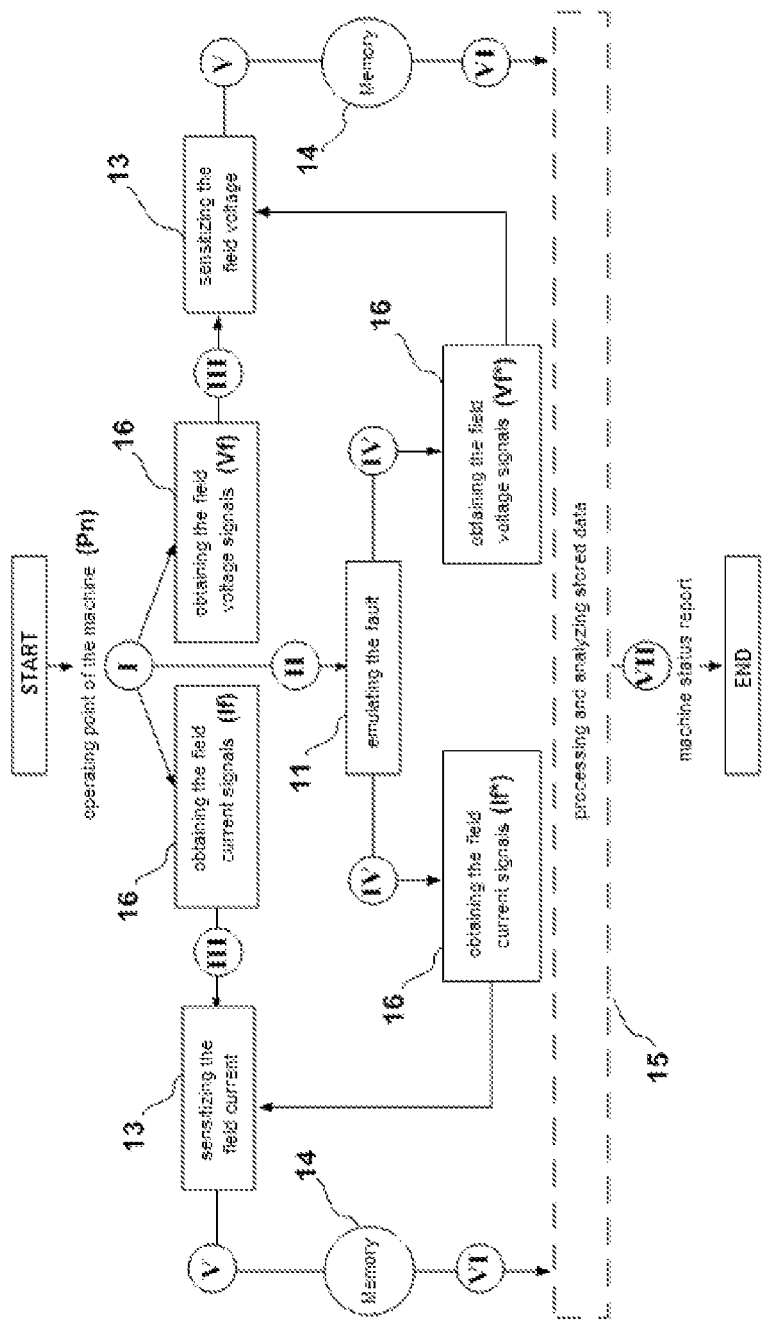
FIG. 5A shows a diagram that describes the fault-measurement method for running electric machines.

The present invention's fault measurement, detection and diagnosis method for running electric machines is described in FIG. 5A and in more detail in FIGS. 5B through 5G, and comprises the following stages:

I. obtaining the field current If and field voltage Vf signals associated with the rotor winding of the electric machine;

II. emulating a fault in the winding of the electric machine;

III. separating the DC level of the field current and field voltage input signals, If and Vf respectively, and amplifying the differences;

IV. separating the DC level of the field current and field voltage input signals, If* and Vf* associated with an emulated fault in the field winding, and amplifying the differences;

V. storing the DC values of the field current and field voltage from normal working conditions (If and Vf) as well as those associated with an emulated fault (If* and Vf*), at different separation and amplification levels;

VI. processing and analyzing the stored values; and

VII. reporting the status of the electric machine.

Figure 5B:
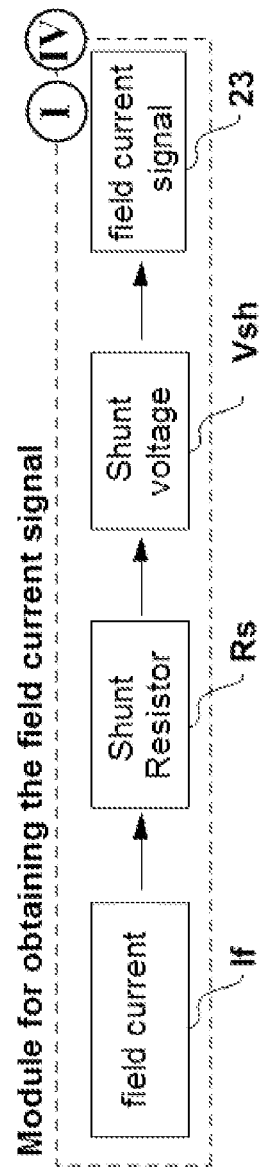
FIGS. 5B through 5G show a detailed form of the steps of the method shown in FIG. 5A, comprising the following stages: (I) obtaining the current and voltage signals; (II) emulating the fault; (III) sensitizing the input signal; (IV) sensitizing the signal with the emulated faults; (V) storing DC and AC values; (VI) processing and analyzing stored data; (VII) machine status report.
Figure 5C:
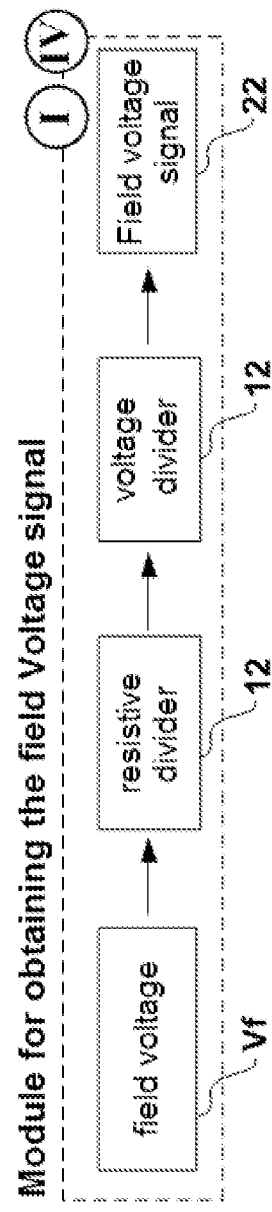

The aforementioned process to measure faults in running electric machines is described in detail by referring to FIGS. 5A through 5G:

As depicted in FIG. 5A and in greater detail in FIGS. 5B and 5C, the first stage in detecting rotor faults consists of: (I) simultaneously obtaining the field current If signal and the field voltage Vf signal of the rotor field winding of the electric machine. To obtain the field current signal If, the voltage over the shunt resistance Rs of the field circuit (2) is measured (see circuit diagram in FIG. 2) and to obtain the field voltage Vf signal, the measurement is made at the resistive-type voltage divider (12) of the field circuit (2).

Figure 5D:
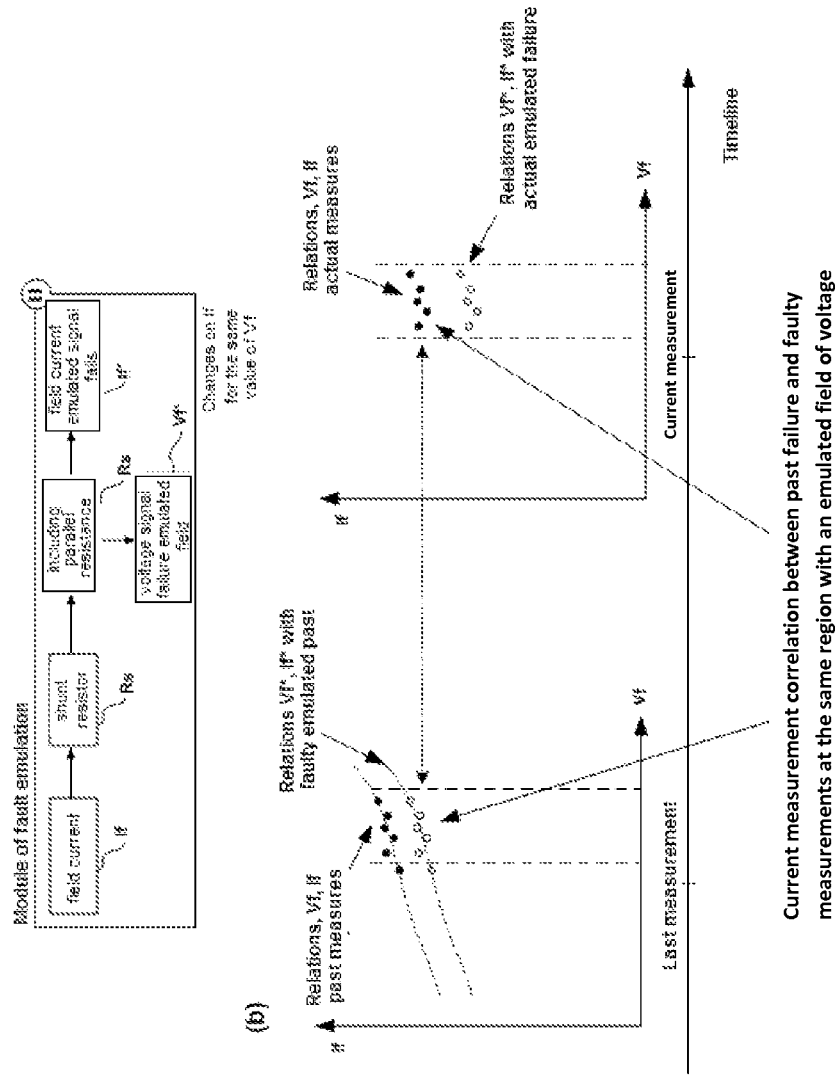
Figure 5E:
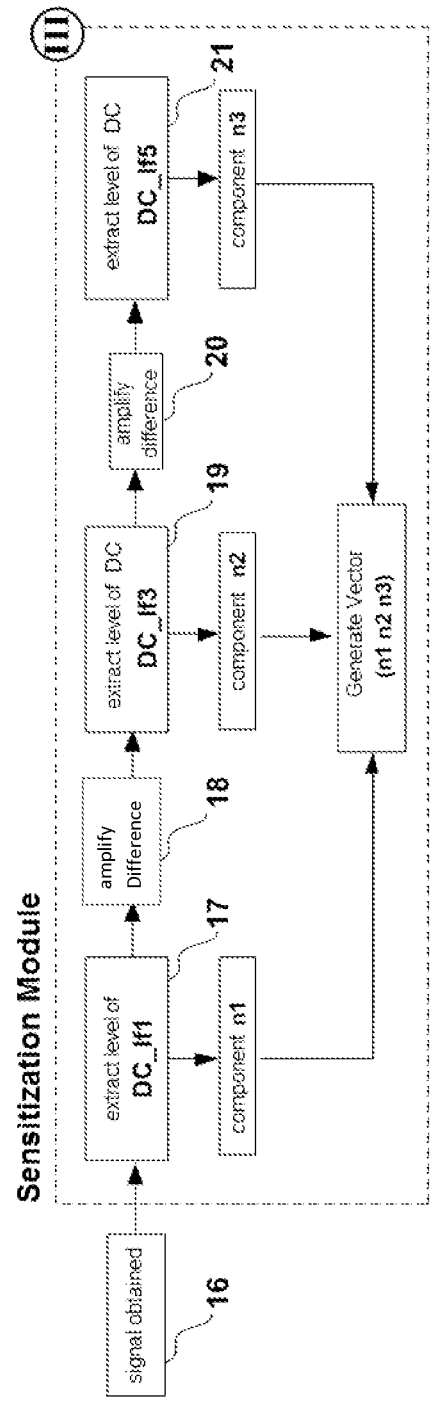
Figure 5F:
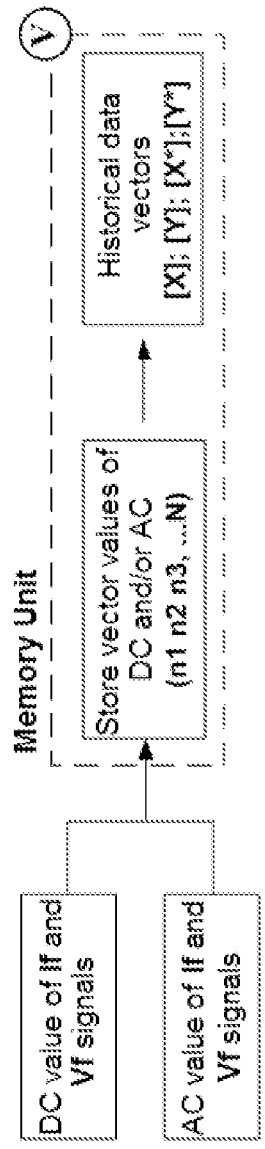
Figure 5G:
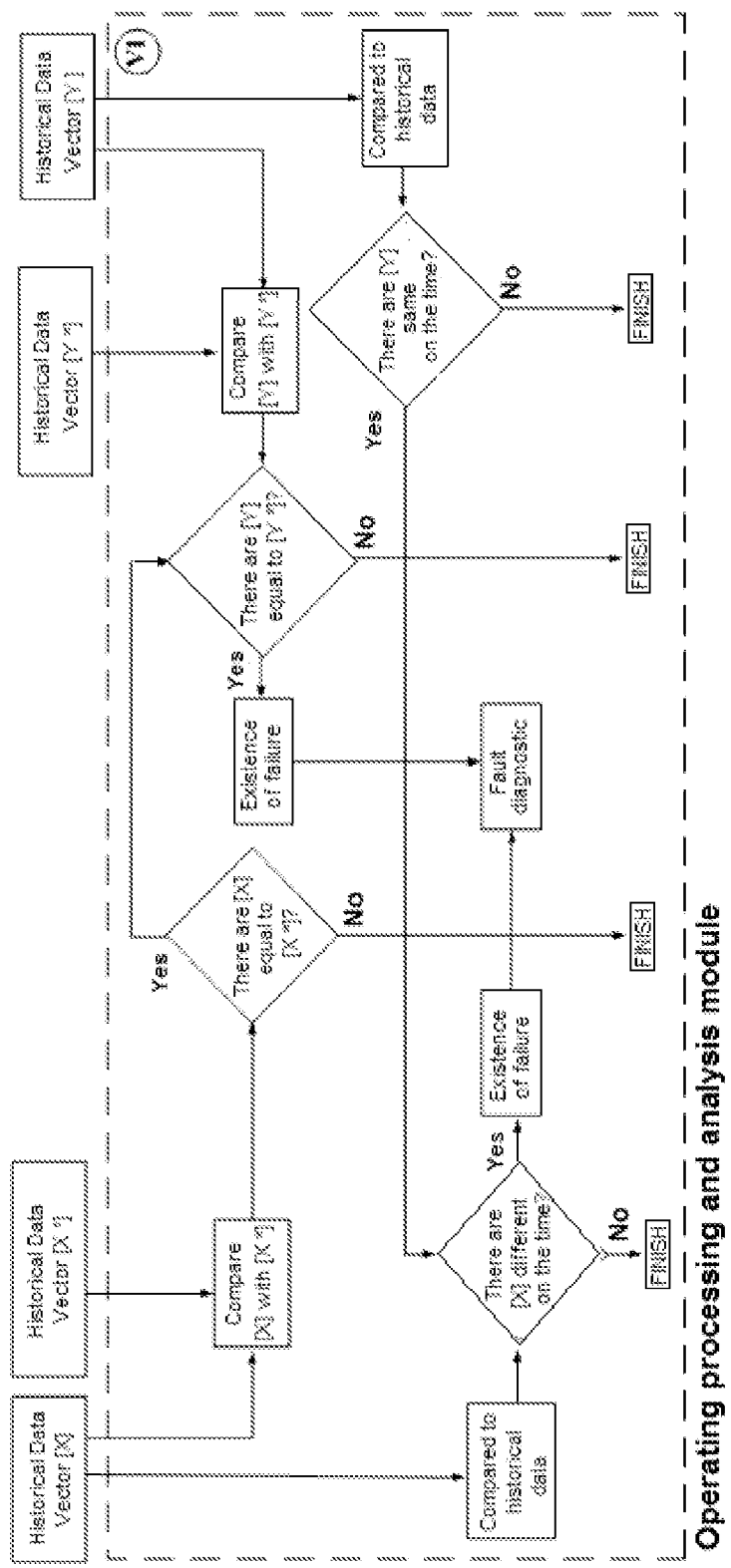

The second stage consists of: (II) emulating a signal that represents a fault in the rotor winding of the electric machine FIG. 5D). This stage is carried out before, during or after the first part of the first stage (obtaining the field current If and field voltage Vf signals of the rotor winding of the electric machine). The field current If signal depends on the value of the field voltage Vf and the status os the machine. There is a group of Vf-If relationships for normal working conditions, within a defined range in a geometric space. When a resistive-type connection fault occurs, the geometric space of the Vf-If relationships changes in such a way that the current values decrease for the same voltage values. As an example, FIG. 5D shows the correlation of the first components of the vector made up of the DC values of the field voltage Vf and the field current If with their respective values for emulated faults.

Fault emulation consists of emulating a change in the field current If signal for the same field voltage Vf value (see FIG. 5D), yielding the If* and Vf* values, which are signal values related to emulated faults. Fault emulation allows the fault values to be coupled with a determined operational state (see FIG. 5D), so that afterward said fault values can be continuously compared with the current and voltage measurements over the field circuit. Fault emulation allows the fault values to be coupled with a determined operational state, so that afterward said fault values can be compared with operational measurements and the system can sound a fault alarm. The operational state that the present invention refers to is the group of field current and field voltage values of the electric machine at a specific instant in time.

The fault emulation unit (11) described herein is composed of a block of passive electrical components selected from resistive-type or capacitive and inductive-type, which are connected in parallel to the unit that obtains the current signal.

The third (III) and fourth (IV) stages consist of sensing (13) the voltage and current signals associated with the field circuit (2). It should be understood that in the present invention, the term 'sensing' or 'sensitization' refers to the separation of the DC and/or AC levels of said signals and the amplification of the differences. The sensitization unit (13) (shown in detail in FIG. 5E for DC level separation) separates the DC level of the signal and amplifies the difference, and then repeats the separation and amplification procedure for each of the resulting signals.

To identify resistive component faults, temperature changes, capacitive component faults and inductive component faults, the sensitization unit is supplied with consecutive separations and amplifications of the DC and/or AC components, so that the DC and AC changes in the measured field voltage Vf and field current If signals can be determined and subsequently associate them to at least one type of fault.

Figure 4:
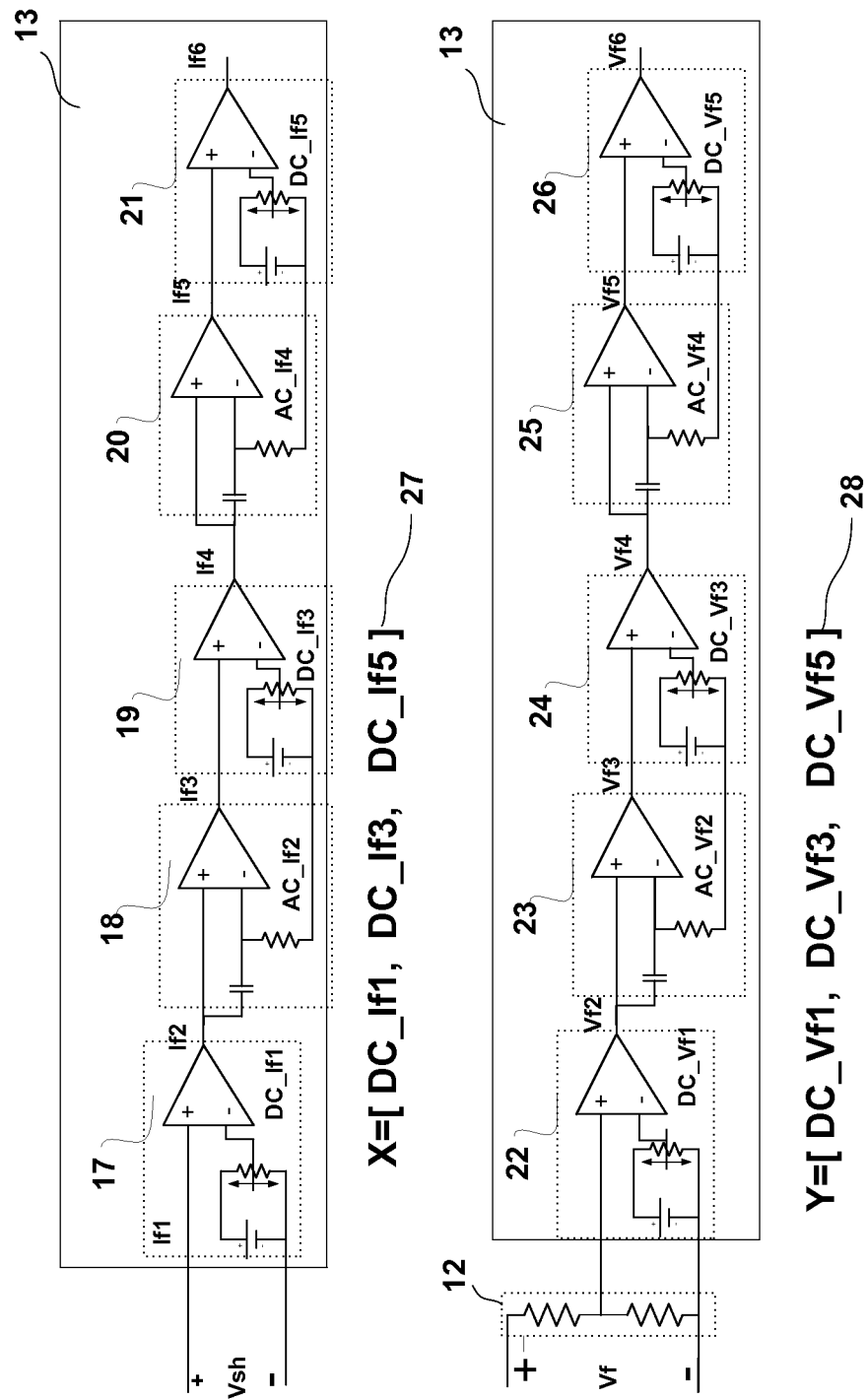
Figure 4A:
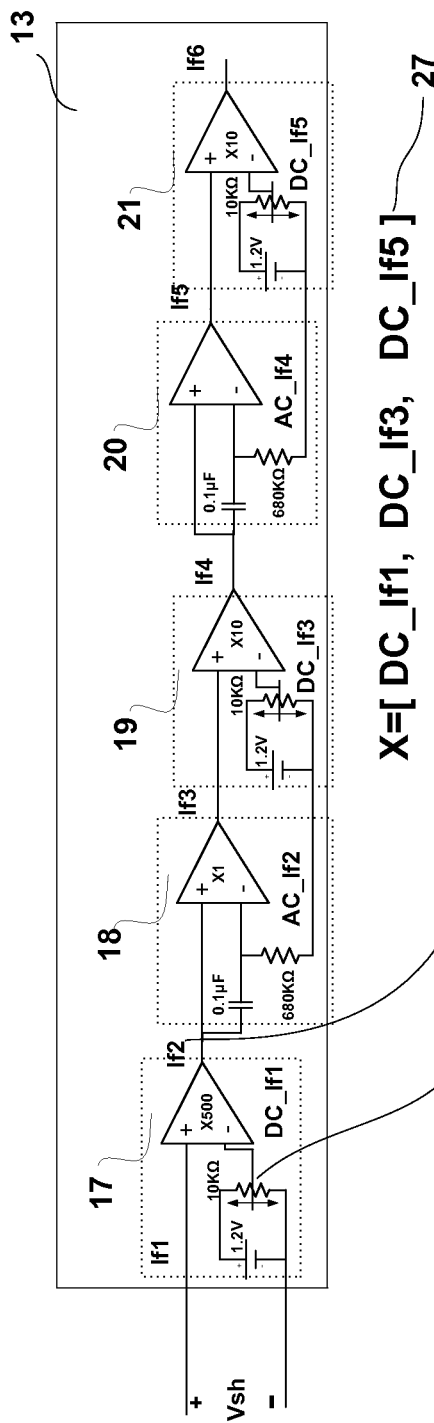
Figure 4A:
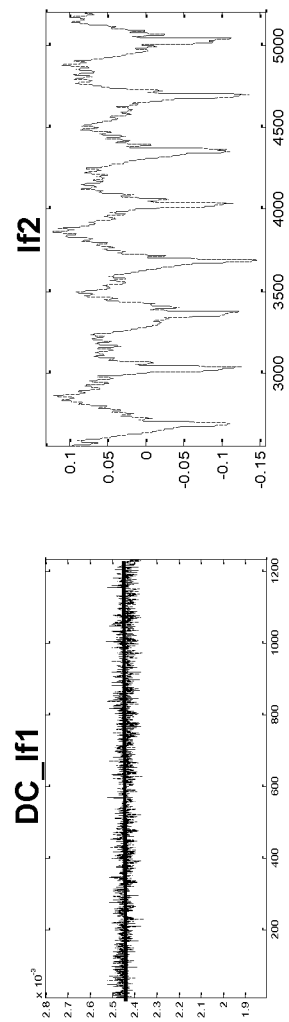
Figure 4B:
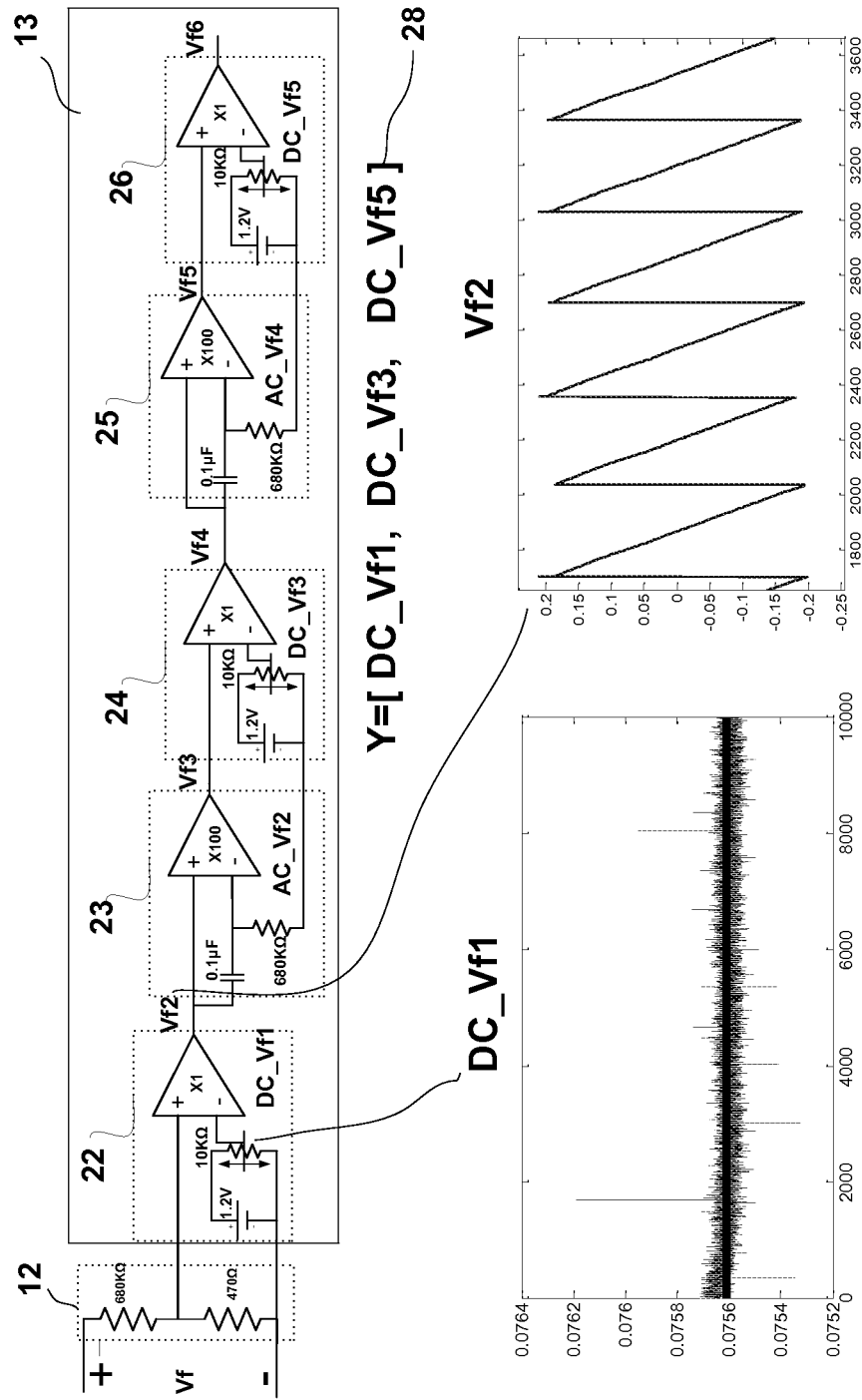

The sensitization unit composed of separation and amplification stages (13) depicted in the electric circuit in FIGS. 4A and 4B, shows a configuration for the identification of the DC changes in the field current signal and the field voltage signal. The unit shown in FIGS. 4A and 4B consists of five amplification levels, but a greater number of levels can be used to detect smaller changes in the input signals. In one of the preferred embodiments of the present invention, the electric circuit has three DC separation levels, followed by an amplification process and two AC separation levels, followed by an amplification process, organized as follows:

Continuing on FIGS. 4A and 4B, in the first amplification level (17) and (22) the DC components of the measured shunt voltage Vsh and field voltage Vf signals are separated, in order to obtain the amplified AC and DC components that were not able to be separated. Separation of the DC component is carried out preferably using a differential amplifier that has an inlet with a variable DC voltage level and is set up to be less than the DC voltage level of the input signal.

The second amplification level (18) and (23) separates the AC component of the signal resulting from (17) and (22), respectively, to obtain the amplified DC component and an AC component from the amplification of the AC component that was not able to be separated. Separation of the AC component is carried out preferably using a differential amplifier, where one of its inlets is equipped with a RC high pass filter.

The third amplification level (19) and (24) separates the DC component of the signal resulting from (18) and (23), respectively, to obtain the amplified AC component and a DC component from the amplification of the DC component that was not able to be separated. Separation of the DC component is carried out preferably using a differential amplifier, where one of its inlets has a DC voltage level that can be varied using a digital potentiometer.

The fourth amplification level (20) and (25) separates the AC component of the signal resulting from (19) and (24), respectively, to obtain the amplified DC component and an AC component from the amplification of the AC component that was not able to be separated. The separation is carried out preferably using a differential amplifier, where one of its inlets is equipped with a RC high pass filter.

The fifth amplification level (21) and (26) separates the DC component of the signal resulting from (20) and (25), respectively, to obtain the amplified AC component and a DC component from the amplification of the DC component that was not able to be separated. The separation is carried out preferably using a differential amplifier, where one of its inlets has a DC voltage level that can be varied using a digital potentiometer.

Figure 3:
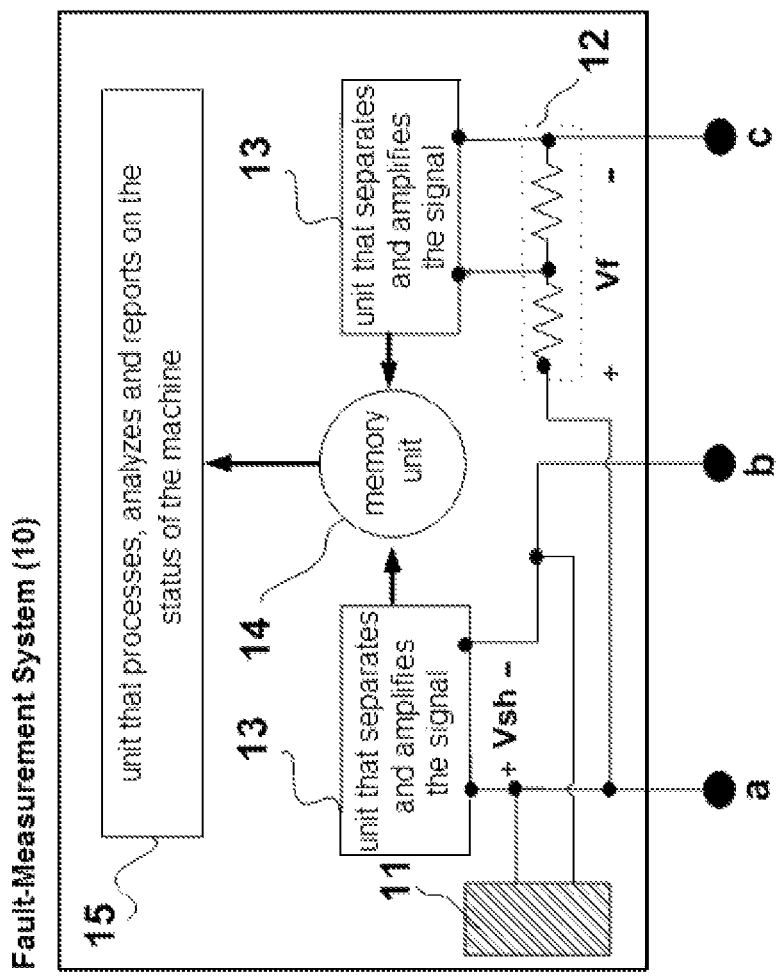

The fifth stage consists of: (V) storing the DC and AC values from the various field current If and field voltage Vf separation and amplification stages in a memory unit (14) (see FIG. 3). The vectors for the normal working signals as well as for the signals associated with an emulated fault If* and Vf* are stored.

In order to facilitate understanding of fault detection and diagnosis, the detection of faults in the resistive component using changes in the DC level values will be described. However, a skilled person will understand that the same method can be used to detect capacitive and inductive faults using changes in AC level values.

For detection of faults in the resistive component, the present invention stores the DC values of the signals in four vectors that are defined as follows:

Vector [X] (27): a vector with components (x1, x2, x3) that correspond to different separation and amplification levels of the DC value of the field current If signal (FIGS. 4A and 4B).

Vector [Y] (28): a vector with components (y1, y2, y3) that correspond to different separation and amplification levels of the DC value of the field voltage Vf signal (FIGS. 4A and 4B).

Vector [X*]: a vector associated with an emulated fault status with components (x1*, x2*, x3*) that correspond to different separation and amplification levels of the DC value of the field current If* signal.

Vector [Y*]: a vector associated with an emulated fault status with components (y1*, y2*, y3*) that correspond to different separation and amplification levels of the DC value of the field voltage Vf* signal.

Determining the components of the [X] and [Y] vectors consists of the following steps (See FIGS. 4A and 4B):

i) The DC levels from the measurement of the voltage over the shunt resistance are extracted, where the corresponding values are DC_If1 and DC_Vf1 and the If1 and Vf1 signals are obtained, respectively. The differences are amplified, producing two sub-signals If2 y Vf2; as shown in (17) and (22). The DC_If1 and If2 signals are shown in detail in order to show the signal separation and amplification results;

ii) The first component n1 of each vector of DC values is determined using the DC levels DC_If1 and DC_Vf1;

iii) The AC levels AC_If2 and AC_Vf2 are extracted to signals If2 and Vf2, respectively, and the differences are amplified, producing two sub-signals If3 and Vf3; as shown in (18) and (23);
iv) The DC levels DC_If3 and DC_Vf3 are extracted to signals If3 and Vf3, respectively, and the differences are amplified, producing two sub-signals If4 and Vf4; as shown in (19) and (24);
v) The second component n2 of each vector of DC values is determined using the DC levels DC_If3 and DC_Vf3;
vi) The AC levels AC_If4 and AC_Vf4 are extracted to signals If4 and Vf4, respectively, and the differences are amplified, producing two sub-signals If5 and Vf5; as shown in (20) and (25);
vii) The DC levels DC_If5 and DC_Vf5 are extracted to signals If5 and Vf5, respectively, and the differences are amplified, producing two sub-signals If6 and Vf6; as shown in (21) and (26);
viii) The third component n3 of each vector of DC values is determined using the DC levels DC_If5 and DC_Vf5;

The components of the [X*] and [Y*] vectors are determined in the same way described for the components of the [X] and [Y] vectors, but it is done while a fault is being emulated.

To detect faults in the inductive and capacitive component, the AC values of the field voltage and field current signals are stored the same way the DC values were stored.

The sixth stage consists of: (VI) processing and analysis (15) (see FIG. 3) of the data stored in the memory unit (14). The processing unit (15) is configured to determine the [X] and [Y] vectors, to identify the variations in the components of the [X] and [Y] vectors, and to compare the [X] and [X*] vectors and the [Y] and [Y*] vectors at the same point of time during operation.

Fault status determination is achieved by identifying time variation between the components of the [X] and [Y] vectors. Once a variation between the components of the [X] and [Y] vectors is determined, it proceeds to compare it with the corresponding components in the vectors associated with an emulated fault [X*] and [Y*]. When the corresponding components are equal, it then deduces that there is a fault in the electric machine, where the type of fault depends on the component that displays a change in the field current vector for the same field voltage value.

5. ILLUSTRATIVE EXAMPLE

The present invention can be applied to detecting faults related to the variation of resistive components in the rotor winding of an electric machine, but it can be used to detect faults related to the variation of inductive or capacitive components.

The field circuit winding contains a resistive component associated with the geometry and conductivity of the conductors, an inductive component associated with the magnetic circuit and a capacitive component associated with the rotor winding insulation.

The field circuit described in FIG. 2 with more than one winding has a splice between windings associated with it. The present invention preferably deals with splices. The connection is depicted as a resistive component, by a group of parallel resistances (8).

Faults in the resistive component are detected by means of variations in the DC level in the field current for the same DC level in the field voltage. The best way of applying the present invention used a synchronous generator such as that in FIG. 1 with a power of 70 MVA, 13.2 kV at the stator terminals, and with a 0.1Ω rotor winding resistance. The DC component of the field voltage of the static excitation system can range from 0V to 100V and the DC component of the field current can range from 0 A to 1000 A. The field circuit has a 60 μΩ shunt resistance Rs and due to current flow, the shunt voltage Vsh ranges from 0 mV to 60 mV. The voltage divider (12) (FIG. 3) was made with two resistors (680 kΩ and 470Ω), using the field voltage signal over the lower-value resistor. Each separation and amplification stage of the sensitization unit (13) has gain values shown in FIG. 4A and FIG. 4B, but any other gain value can be used. The group of DC values Vf, If for a non-fault status would be 100V, 1000 A which yield the following results after being transformed into the measured variables:

$$Vf = 100 \text{ V}\left(\frac{470\Omega}{470\Omega + 680 \text{ k}\Omega}\right) = 69.07 \text{ mV}$$

$$Vsh = 1000 \text{ A}(60 \text{ }\mu\Omega) = 60 \text{ mV}$$

Using the separation and amplification method of the present invention yields: a vector for the field current signal represented in the shunt voltage and a vector for the field voltage signal, as follows:

$$Y=[69 \text{ mV } 6.9 \text{ mV } 9.07 \text{ mV}]$$

$$X=[60 \text{ mV } 0 \text{ mV } 0 \text{ mV}]$$

If there is a resistive-type fault that causes a permanent increase in the resistive components of 100μΩ, there will be a field current decrease of 900 mA. These variations are reflected in a shunt voltage decrease of 60 μV.

In this case, the resulting vectors would be:

$$Y\text{fault}=[69 \text{ mV } 6.9 \text{ mV } 9.07 \text{ mV}]$$

$$X\text{fault}=[59 \text{ mV } 47 \text{ mV } 0 \text{ mV}]$$

Comparing the resulting vectors:

| Y = [69 mV | 6.9 mV | 9.07 mV] |
|---|---|---|
| X = [60 mV | 0 mV | 0 mV] |
| Yfault = [69 mV | 6.9 mV | 9.07 mV] |
| Xfault = [59 mV | 47 mV | 0 mV] |

As can be noted, due to the effect of the fault, there is variation between the field current vectors for the same field voltage vector, and fault status can be deduced based on the variations of each component of the vectors.

The invention claimed is:

1. A method for the detection and diagnosis of faults in running electric machines, the electric machine having a field circuit that contains a rotor winding connected to a static excitation system, the method characterized by the following steps:
   a. connecting probes (a), (b) and (c) as follows:
      connecting probe (a) between the rotor winding of the electric machine and a resistor that is connected to the static excitation system;
      connecting probes (b) and (c) to the ends of the static excitation system;
   b. simultaneously obtaining at least one current signal (If) and one voltage signal (Vf) from the rotor field winding; wherein signal (If) is measured on the resistor which is between probes (a) and (b); and signal (Vf) is measured between probes (b) and (c);

c. separating and amplifying DC and AC components, or any of them, in the current signal (If) and the voltage signal (Vf), at least through:
   i) a first separation of the DC value from the signals of step b), using a differential amplifier; and a first amplification, using an operational amplifier, to a sub-signal;
   ii) separation of AC value from the sub-signal of step (i), using a differential amplifier; and amplification, using an operational amplifier, to a sub-signal;
   iii) separation of DC value from the sub-signal of step (ii), using a differential amplifier; and amplification, using an operational amplifier, to a sub-signal;

d. storing in memory units the sub-signals of step (c), forming Vector [X] with components corresponding to separation and amplification levels of DC and/or AC values of the field current (If) and Vector [Y] with components corresponding to separation and amplification levels of the DC value of the field voltage (Vf);

e. making controlled variations in equivalent resistance, capacitance or inductance values of the rotor winding by connecting external elements of the resistive-type, capacitive or inductive-type, between any of the probes (a), (b) or (c), and obtaining current signals (If*) and voltage signals (Vf*) associated with the variations of the resistance, capacitance or inductance;

f. separating and amplifying DC and AC components, or any of them, in the current signal (If*) and the voltage signal (Vf*), at least through:
   i) a first separation of the DC value from the signals of step e), using a differential amplifier; and a first amplification, using an operational amplifier, to a sub-signal;
   ii) separation of AC value from the sub-signal of step (iv) using a differential amplifier and amplification using an operational amplifier to a sub-signal;
   iii) separation of DC value from the sub-signal of step (v) using a differential amplifier and amplification using an operational amplifier to a sub-signal;

g. storing in memory units the sub-signals of step (c), forming Vector [X*] with components corresponding to separation and amplification levels of the DC value of the field current (If*) and Vector [Y*] with components corresponding to separation and amplification levels of the DC value of the field voltage (Vf*);

h. comparing vectors of steps (d) and (g) to detect the existence of fault; wherein a fault is detected if:
   [Y] is equal to vector [Y*] and [X] is equal to vector [X*]; or
   if two vectors [X] from DC and/or AC levels stored in the memory unit are different when those associated vectors [Y] are equal each other;

i. and activating an alarm if the existence of a fault is detected in step (h).

2. The method of claim 1, where the differences in the components of [X], [X*], [Y] and [Y*] vectors for DC and AC values determine the type of fault.

3. The method from claim 2, where faults associated with resistive components are determined by analyzing variations in the DC values.

4. The method from claim 2, where faults associated with inductive and capacitive components are determined by analyzing variations in the AC values.

* * * * *